United States Patent [19]

Ullrich

[11] 4,356,407

[45] Oct. 26, 1982

[54] INPUT CIRCUIT FOR BUCKET BRIGADE

[75] Inventor: Manfred F. Ullrich, Denzlingen, Fed. Rep. of Germany

[73] Assignee: ITT Industries, Inc., New York, N.Y.

[21] Appl. No.: 254,707

[22] Filed: Apr. 16, 1981

Related U.S. Application Data

[63] Continuation of Ser. No. 19,397, Mar. 12, 1979, abandoned.

[30] Foreign Application Priority Data

Mar. 30, 1978 [DE] Fed. Rep. of Germany ....... 2813606

[51] Int. Cl.³ .................... G11C 19/28; H03K 13/34
[52] U.S. Cl. ........................... 307/221 D; 307/221 C
[58] Field of Search ...................... 307/221 C, 221 D; 333/165

[56] References Cited

U.S. PATENT DOCUMENTS

| | | | |
|---|---|---|---|
| 3,819,953 | 6/1974 | Puckette et al. | 307/221 D |
| 3,819,954 | 6/1974 | Butler et al. | 307/221 D |
| 3,939,364 | 2/1976 | Adam et al. | 307/221 C |
| 4,076,986 | 2/1978 | Croisier et al. | 307/221 D |
| 4,100,513 | 7/1978 | Weckler | 307/221 C |

Primary Examiner—John S. Heyman
Attorney, Agent, or Firm—John T. O'Halloran; David M. Quinlan

[57] ABSTRACT

An input circuit of a bucket brigade circuit consists of an input transistor and an input capacitor. The input capacitor is shunting the drain-source path of the input transistor.

4 Claims, 2 Drawing Figures

4,356,407

INPUT CIRCUIT FOR BUCKET BRIGADE

This is a continuation of application Ser. No. 019,397, filed Mar. 12, 1979, now abandoned.

BACKGROUND OF THE INVENTION

This invention relates in general to an output circuit and more particularly to an input circuit for a bucket brigade employing an input capacitor shunting the input transistor.

In conventional types of input circuits for bucket brigade circuits of insulated-gate field-effect transistors (MOS-bucket brigades), the input stage consists of an input transistor and of an input capacitor having one terminal applied to the end of the controlled current path of the input transistor not facing the input, and having another terminal applied to the zero point of the circuit, e.g. to ground, of "IEEE Journal of Solid-State Circuits", April 1973, pp 157 to 168, especially FIG. 1 on page 158. In this prior publication, the connecting together of both the input transistor and the input capacitor is referred to as the input scanning stage. Via this connection to the zero point of the circuit which is the only connection of this kind in such MOS-bucket brigades—as is well known, they are clock-signal operated circuits—interferences may act upon the signal which is to be led via the MOS-bucket brigade, for example, whenever it is impossible to arrange the connecting point of the input capacitor with the zero point of the circuit in such a way as to be a potential point which is as free as possible from equalizing current.

SUMMARY OF THE INVENTION

Accordingly, it is the object of this invention as defined in claim 1, to modify the input circuit in such a way as to eliminate the interference spread possible via the connection with the zero point of the circuit, so that it can be completely done without a zero point of the circuit connection of such MOS-bucket brigades.

According to this invention there is provided an input circuit for bucket brigade circuits of insulated-gate field-effect transistors consisting of transistors of the same conductivity and control type which are connected in series with their controlled current paths, the drain and gate of each of which are bridged by a capacitor, with said input circuit consisting of an input transistor of the same conductivity and control type arranged with its controlled current path in series with that of the first transistor of the MOS-bucket brigade, as well as of an input capacitor whose one terminal is connected to the point connecting the controlled current paths of both the first and the input transistor, wherein the improvement comprises that the other terminal of said input capacitor is connected to the input.

BRIEF DESCRIPTION OF THE DRAWINGS

This invention will now be described in greater detail with reference to FIGS. 1 and 2 of the accompanying drawings, in which.

DETAILED DESCRIPTION OF THE INVENTION

Figure 1:
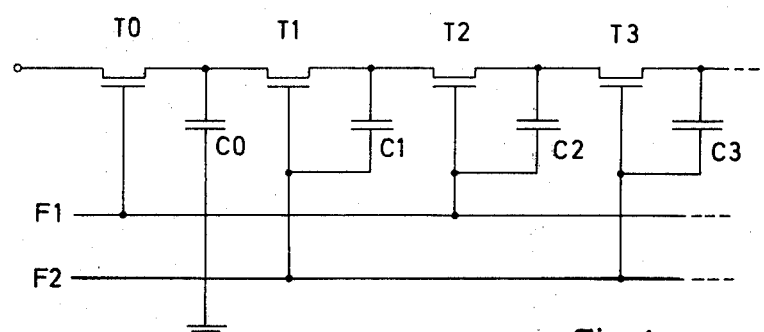
FIG. 1 shows the circuit diagram of a MOS-bucket brigade with the conventional input circuit.

FIG. 1 shows the input circuit and the first three stages of a conventional MOS-bucket brigade. The controlled current paths of the input transistor T0 and the trasistors T1, T2, T3 are shown to be arranged in series between the input E and the further not shown transistors of the MOS-bucket brigade, which may have a number of stages amounting to several hundred. Each of the shown transistors is associated with a capacitor, i.e. transistors T1, T2, T3 are associated with the capacitors C1, C2, C3 arranged between the drain and the gate of the respective transistor of the same number. The input capacitor C0 is applied with its one terminal to the drain of transistor T0 and, with its other terminal, to the zero point of the circuit, e.g. to ground.

The gates of the even-numbered transistors T0, T2 are connected to one another and are applied to a first clock signal F1 while the gates of the odd-numbered transistors T1, T3 which are likewise connected to one another, are operated by a second clock signal F2. The curve as a function of time t of these clock signals F1, F2 is shown in FIG. 1 relating to the case of a N-channel enhancement type MOS-bucket brigade. Each clock signal consists of a square wave and equal-frequency voltage of the amplitude U, with that of the one clock signal lying in the gap between the effective pulses of the other clock signal, and vice versa. As is evident, the clock signals F1, F2 have a pulse duty factor of 0.5; it is also possible to choose a pulse duty factor deviating therefrom, in such a way that intervals appear between the effective pulses of the two clock signals, during which both clock signals are at zero. It is still to be mentioned that also the square wave form is not compulsory, but that also triangular clock signals are suitable for operation.

For realizing such MOS-bucket brigades there is provided transistors which are alike with respect to conductivity and control type, that is, either N-channel or P-channel transistors, and either transistors of the enhancement or of the depletion type should be used; in other words, there may be chosen among four different types of transistors (N-channel enhancement type, P-channel enhancement type, N-channel depletion type, P-channel depletion type).

As is well known, the mode of operation of those MOS-bucket brigades is such that at the end of each clock pulse each second stage, hence each odd-numbered or each even-numbered stage, contains a signal information in the form of a charge quantity stored in the associated capacitor, while the capacitors of the stages lying therebetween, have a so-called neutral voltage value and, consequently, contain no information. The potentials at the corresponding nodal points then have assumed the same differential potential from the amplitude U of the clock signals and the threshold voltage as occurring between the gate and the source of the respective transistor. On account of this, the discharge via the respective transistor lying on the right, has come to a standstill.

Figure 2:
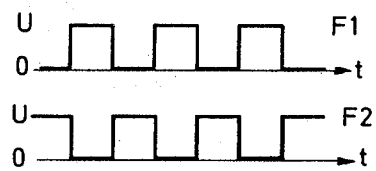
FIG. 2 is an example of a preferred embodiment, showing the circuit diagram of a MOS-bucket brigade employing the input circuit according to this invention.
Figure 2:
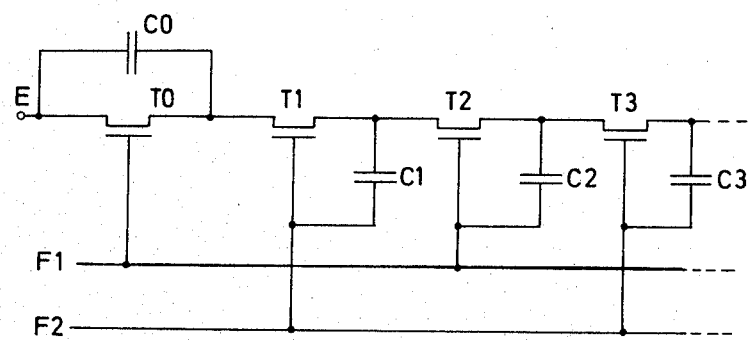

The MOS-bucket brigade according to the example of embodiment of this invention is shown in FIG. 2, and with the exception of the input circuit, is designed in the same way as the MOS-bucket brigade according to FIG. 1, as may be seen from the same reference numerals. According to this invention, the input capacitor C0 which, in FIG. 1, is connected with its terminal to the zero point of the circuit, is now applied to the input E. In this way, the aforementioned disadvantages of the arrangement do not occur, and there may be completely desisted from the zero point-of-the-circuit connection. In particular, to the terminal of the input capacitor C0 designed as a printed conductor, there is only still applied one useful signal potential, and no longer the potential of the zero point of the circuit which is affected by possible noise signals.

While I have described above the principles of my invention in connection with specific apparatus it is to be clearly understood that this description is made only by way of example and not as a limitation to the scope of my invention as set forth in the objects thereof and in the accompanying claims.

I claim:

1. An insulated-gate field effect transistor bucket brigade circuit comprising a plurality of stage transistors each having a source, drain and gate connected in an array with the drain of each stage transistor connected to the source of another said stage transistor to define a like plurality of stages in said array, with the gates of said stage transistors in even-numbered stages interconnected for connection to a first clock signal and with the gates of said stage transistors in odd-numbered stages interconnected for connection to a second clock signal; a like plurality of stage capacitors, each of which is connected across the gate and drain of one of said stage transistors; and an input stage including an input transistor, having a source for providing an input terminal to said bucket brigade circuit, a drain connected to the source of said first stage transistor and a gate connected to the gates of said even-numbered stage transistor, and an input capacitor connected across the source and drain of said input transistor, wherby said bucket brigade circuit is isolated from ground to eliminate undesired ground potential variations.

2. The bucket brigade circuit recited in claim 1 wherein said stage and input transistors are insulated-gate field-effect transistors of the same conductivity and control type.

3. The bucket brigade circuit recited in claim 1 or 2 wherein said gates of said odd-numbered stage transistors are connected to a first clock signal generator and said gates of said input and even-numbered stage transistors are connected to a second clock signal generator, wherein said second clock signal generator produces a pulse between pulses produced by said first clock signal generator.

4. The bucket brigade circuit recited in claim 3 wherein said clock signal generators each generate square-wave, equal frequency pulses having a pulse duty factor of 0.5.

* * * * *